(12) United States Patent
Pham et al.

(10) Patent No.: US 9,064,932 B1
(45) Date of Patent: Jun. 23, 2015

(54) METHODS OF FORMING GATE STRUCTURES BY A GATE-CUT-LAST PROCESS AND THE RESULTING STRUCTURES

(71) Applicant: GLOBALFOUNDRIES Inc., Grand Cayman (KY)

(72) Inventors: Daniel T. Pham, Clifton Park, NY (US); Zhenyu Hu, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/268,478

(22) Filed: May 2, 2014

(51) Int. Cl.
*H01L 21/70* (2006.01)
*H01L 21/768* (2006.01)
*H01L 21/8234* (2006.01)
*H01L 29/423* (2006.01)
*H01L 27/092* (2006.01)

(52) U.S. Cl.
CPC .... *H01L 21/76838* (2013.01); *H01L 21/76865* (2013.01); *H01L 21/823437* (2013.01); *H01L 29/42316* (2013.01); *H01L 29/4232* (2013.01); *H01L 27/092* (2013.01)

(58) Field of Classification Search
CPC .............. H01L 21/76838; H01L 21/76865; H01L 21/823437; H01L 29/42316; H01L 29/4232; H01L 27/092
USPC .................. 257/369; 438/221, 199
See application file for complete search history.

(56) References Cited

U.S. PATENT DOCUMENTS 8,957,481 B2 * 2/2015 Zhu et al. ............. 257/369

* cited by examiner

*Primary Examiner* — Tu-Tu Ho
(74) *Attorney, Agent, or Firm* — Amerson Law Firm, PLLC

(57) ABSTRACT

One method disclosed includes, among other things, forming an uncut line-type gate structure above first and second spaced-apart active regions of a semiconductor substrate, forming a sidewall spacer around a perimeter of the line-type gate structure, performing at least one etching process to remove an axial portion of a gate cap layer and an axial portion of a gate electrode that are positioned above the isolation region so as to thereby define first and second cut end surfaces of first and second gate electrodes, respectively, and an isolation plug cavity and forming a gate cut isolation plug in the isolation plug cavity.

24 Claims, 18 Drawing Sheets

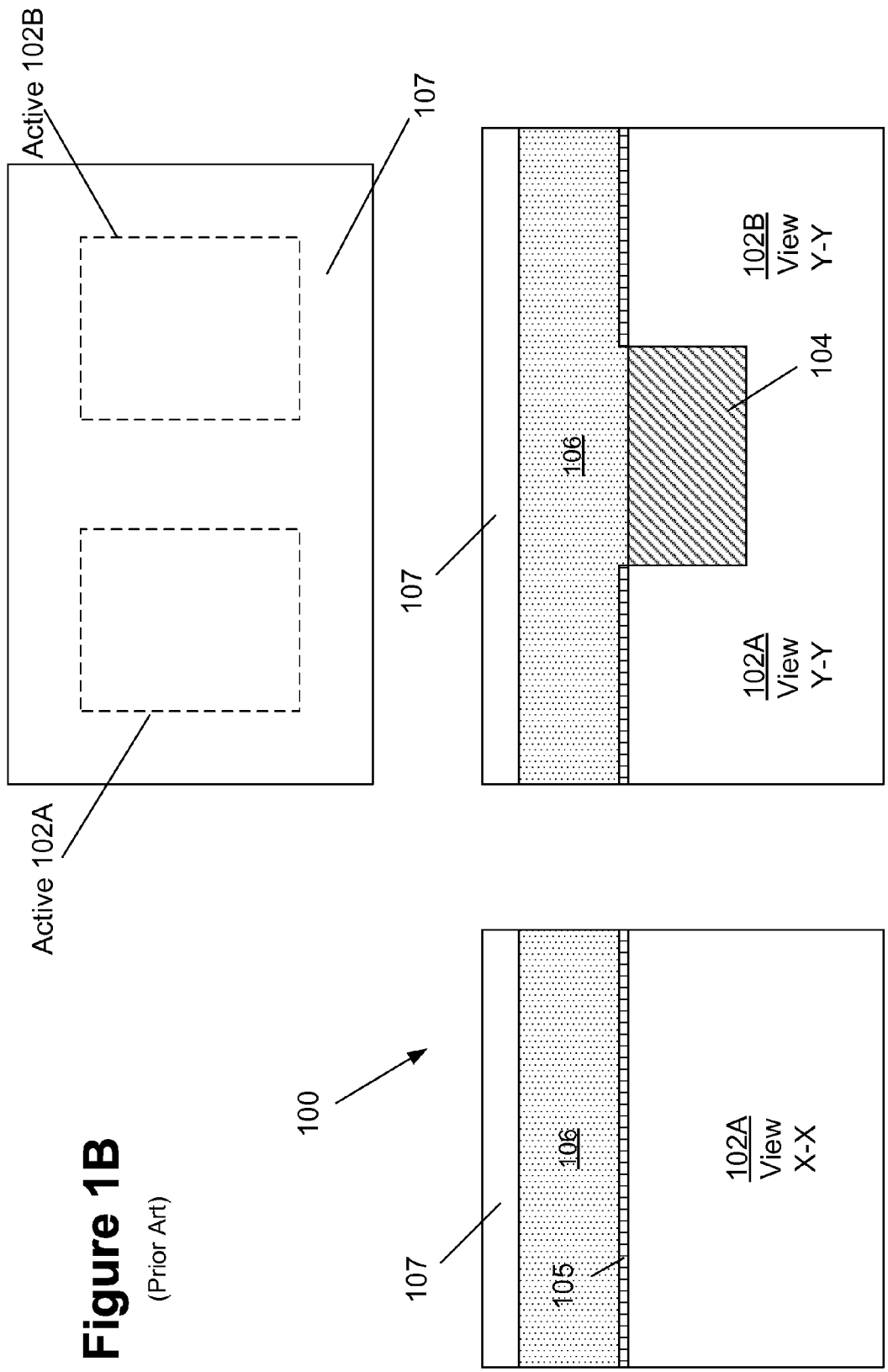

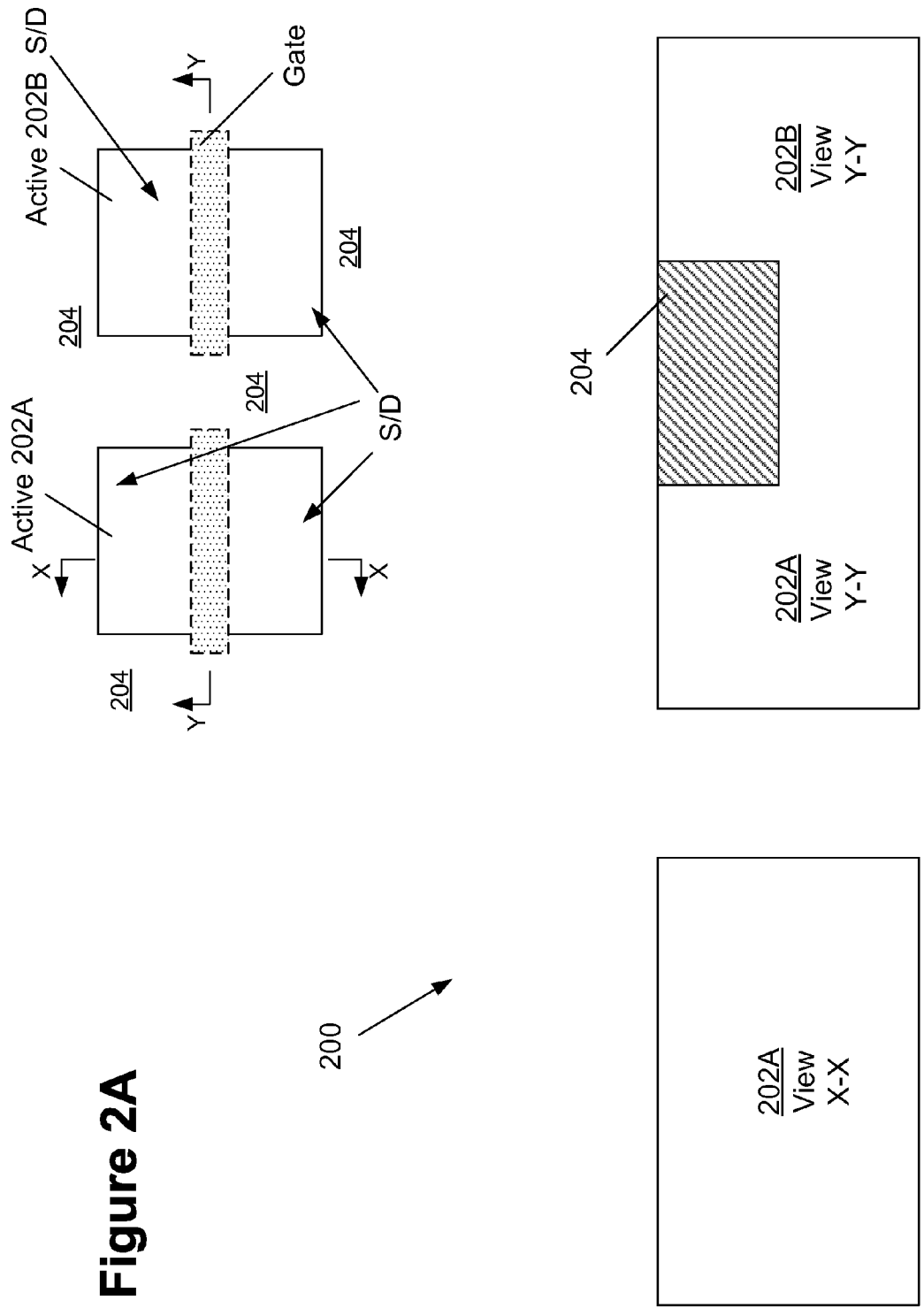

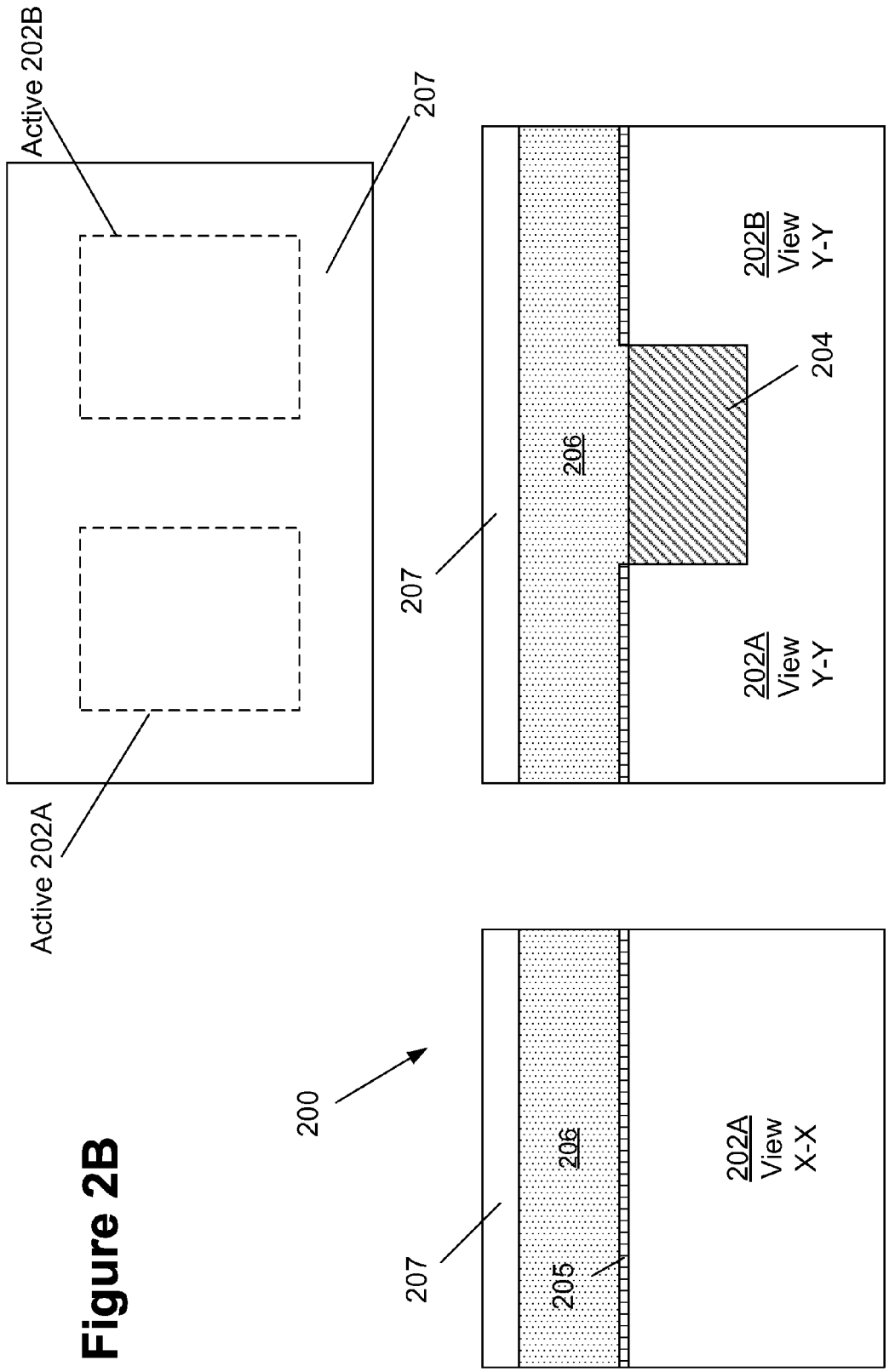

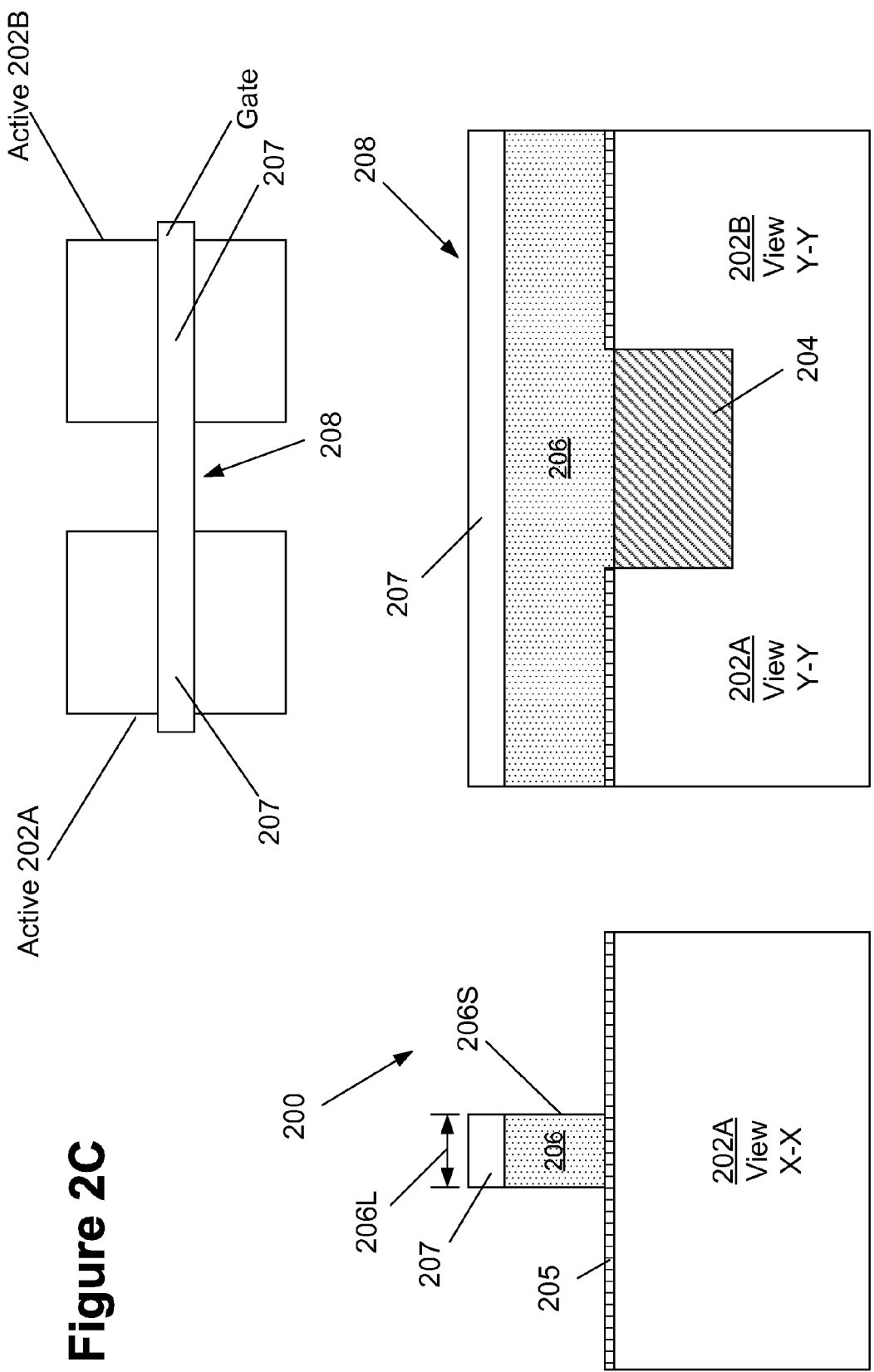

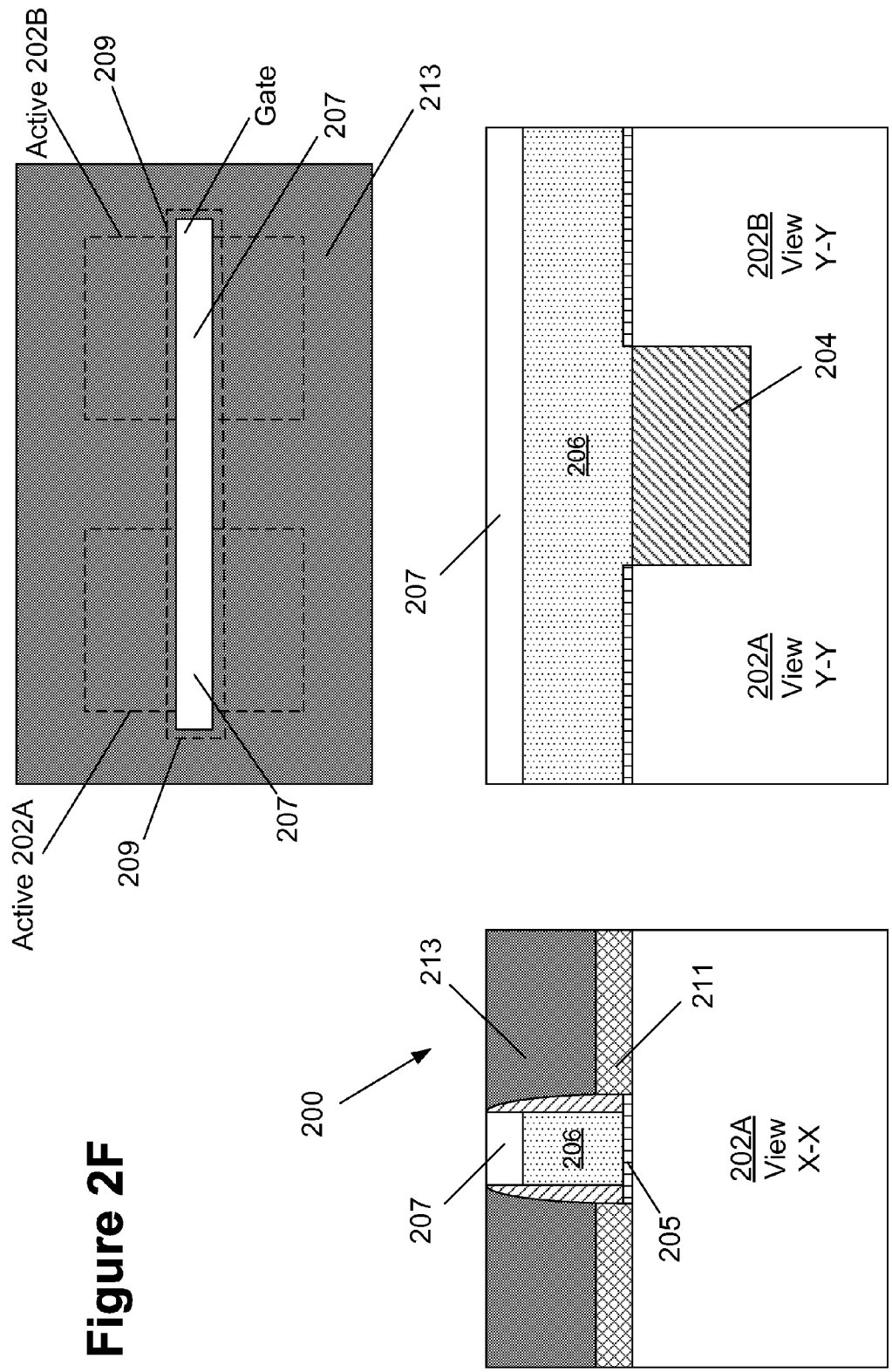

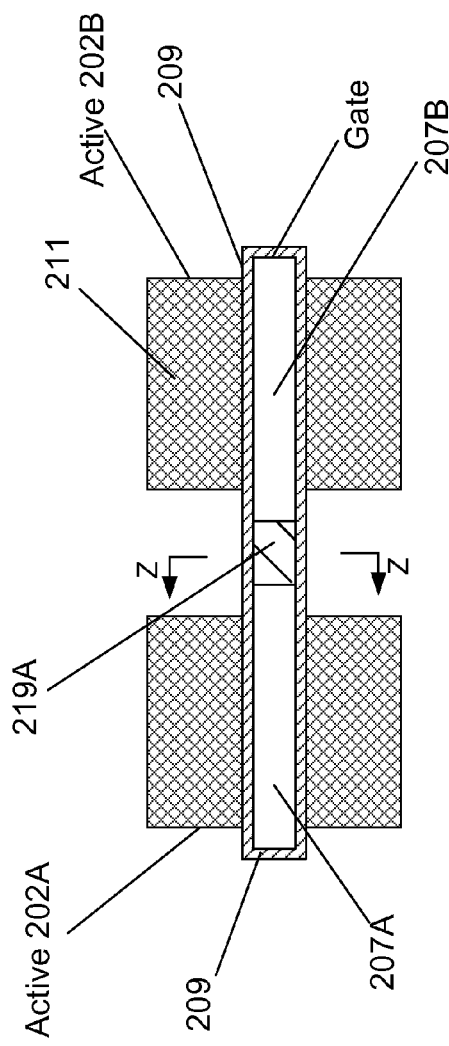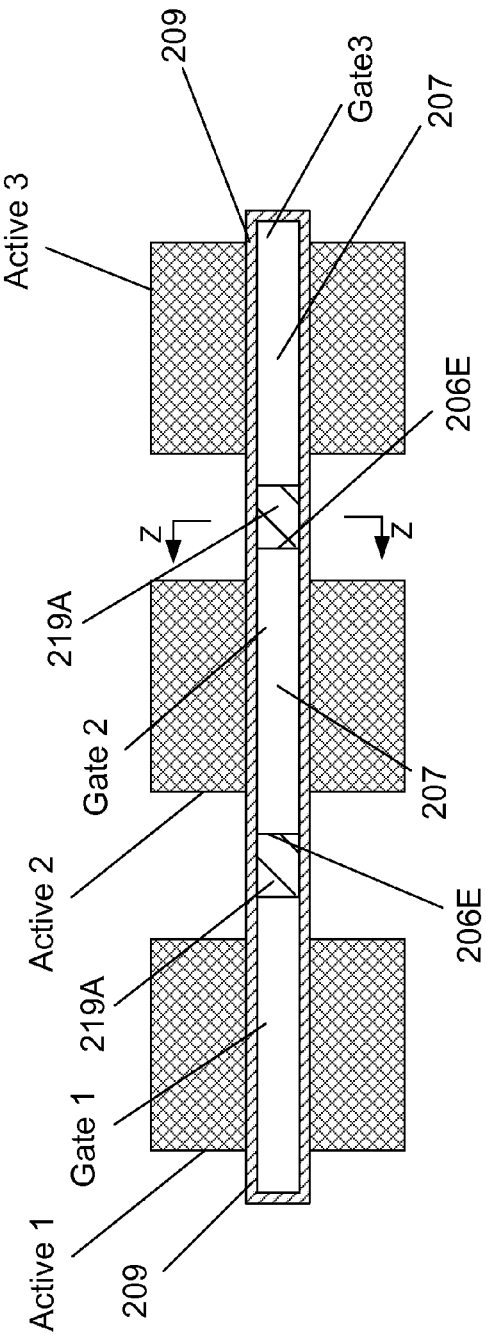

METHODS OF FORMING GATE STRUCTURES BY A GATE-CUT-LAST PROCESS AND THE RESULTING STRUCTURES

BACKGROUND OF THE INVENTION

1. Field of the Invention

The present disclosure generally relates to the fabrication of integrated circuits, and, more particularly, to various methods of forming gate structures by performing a gate-cut-last process and the resulting structures.

2. Description of the Related Art

In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source and drain regions that are formed in a semiconducting substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device.

In general, one commonly employed technique for forming gate structures for either planar or 3D devices involves forming a line-type gate electrode structure above a layer of insulating material that is formed above an active region defined in a semiconductor substrate. Typically, the line-type gate electrode structures are formed by depositing or thermally growing a layer of gate insulation material, e.g., silicon dioxide, on the spaced-apart active regions that are separated by isolation material, blanket-depositing a layer of gate electrode material, e.g., polysilicon or amorphous silicon, on the gate insulation layer and blanket-depositing a gate cap material layer on the layer of gate electrode material. Thereafter, gate electrodes for the devices are typically formed by patterning at least the gate cap layer and the layer of gate electrode material to define long parallel line-type structures, i.e., gate electrode structures, that extend across multiple spaced-apart active regions and the isolation regions formed in the substrate between such spaced-apart active regions. These long, line-type gate electrode structures are initially patterned so as to have the desired critical dimension, i.e., the dimension of gate electrode corresponding to the "gate length" (or direction of current travel) of the finished device. At some point later in the process flow, these long, line-type gate electrode structures are subsequently "cut" by performing an etching process to define the gate electrodes having the desired length in the "gate-width" direction of the transistor device. This results in substantially rectangular-shaped gate structures (when viewed from above) having the desired dimensions in the gate-length and gate-width directions.

After the gate electrodes are patterned, a sidewall spacer is typically formed around the perimeter of the substantially rectangular-shaped gate structure, i.e., the spacer is formed adjacent all four side sidewalls (two sidewalls and two end surfaces) of each of the patterned gate electrodes. In some cases, a thin liner layer may be formed on the gate structure prior to forming the sidewall spacer. The sidewall spacer, in combination with the gate cap layer, function to protect the gate electrode structure in subsequent processing operations. In the case where transistor devices are manufactured using so-called gate-first processing techniques, the gate structures (gate electrode plus the gate insulation layer) formed as described above are final gate structures for the device. In the situation where transistor devices are manufactured using so-called gate-last processing techniques, the gate structures (gate electrode and gate insulation layer) formed as described above are sacrificial in nature and will be subsequently removed (after several process operations are performed) and replaced with a final gate structure for the device. In the gate-last processing technique, the final gate structure typically includes one or more layers of high-k (k greater than 10) insulating material and one or more layers of metal that constitute at least part of the conductive gate electrode of the final gate structure.

Unfortunately, as device dimensions have decreased and packing densities have increased, it is more likely that, when epi semiconductor material is formed in the source/drain regions of the planar or 3D transistor device, some of the epi material may undesirably form on the end surfaces of the polysilicon/amorphous silicon gate electrode. This may occur for several reasons. The extent and amount of undesirable epi semiconductor material formation will vary depending upon the particular application and the quality of the manufacturing processes used to manufacture the device. In a worst case scenario, this undesirable epi semiconductor material may form around the entire end surface of a particular gate electrode so as to effectively from a conductive "bridge" between one or both of the source/drain regions and the gate electrode. In another example, such undesirable epi semiconductor material may span the space between the opposing end surfaces of two spaced-apart gate electrode structures, wherein the epi material may form on one or both of the spaced-apart gate structures. As a result of such undesirable and unpredictable epi formation, the resulting semiconductor devices and the integrated circuits including such devices may completely fail or operate at less than acceptable performance levels. One solution to remedy the potential formation of such undesirable epi material would be to simply make the end-to-end spacing between two adjacent gate structures and the pitch between such adjacent gate structures large enough so extra thick spacers could be formed around the gate structures. However, such a "solution" would lead to reduced packing densities, which is counter to the ongoing trend in the industry now and for the foreseeable future.

FIGS. 1A-1E simplistically depict one illustrative prior art process for forming gate structures and the problems that may be encountered when forming epi material using such a process flow. In general, the drawings contain a plan view and various cross-sectional views that are taken where indicated in the plan view. The plan view in FIG. 1A depicts two spaced-apart active regions 102A, 102B that are separated by isolation material 104, and two illustrative gate structures (depicted in dashed lines in FIG. 1A since they are not yet formed at this point in the process flow). With continuing reference to the plan view in FIG. 1A, the view "X-X" is a cross-sectional view taken along the "gate-length" or current transport direction for the finished transistor device formed above the active region 102A, i.e., a cross-sectional view through the gate structures. The view "Y-Y" is a cross-sectional view that is taken through the long axis of the gate structures formed above both of the active regions 102A, 102B, i.e., a cross-sectional view through the gate structures in the gate-width direction of the transistor devices.

FIG. 1A depicts the product 100 at a point in fabrication wherein the spaced-apart active regions 102A, 102B were defined in the substrate 102 by the formation of isolation structures 104. The isolation structures 104 may be formed using well-known techniques. The overall size of the active regions 102A, 102B may vary depending upon the particular application.

FIG. 1B depicts the product 100 after a layer of gate insulation material 105, a layer of gate electrode material 106 and a layer of gate cap material 107 were blanket-deposited above the product 100. In the plan view in FIG. 1B, the outlines of the active regions 102A, 102B are depicted in dashed lines for reference purposes.

FIG. 1C depicts the product 100 after one or more etching processes were performed through one or more patterned etch masks, e.g., patterned layers of photoresist material, to pattern the various layers of material and thereby define a gate stack 101X. These etching processes define gate structures 101X having a gate electrode 106 with substantially vertically oriented sidewalls 106S (view X-X) and tapered end surfaces 106E (view Y-Y). The tapered end surfaces 106E are formed due to the relatively close spacing between adjacent end surfaces 106E, and the resulting etch-loading effects. The patterning of the gate stacks 101X is typically accomplished by performing a first etching process to define long line-shaped features that may span across several active regions, having a width 101L corresponding to the gate-length or "critical dimension" of the finished transistor device. Then, at some point later in the process flow, a so-called "gate-cut" process is performed to cut the line-shaped features into individual gate structures, each of which may span one or more active regions. The second gate-cut process is reflected by the formation of the space 111 between the two separate gate structures positioned above the active regions 102A-B, respectively. That is, using prior art methods, the end face surfaces 106E are patterned after patterning the side surfaces 106S of what will ultimately become the substantially rectangular-shaped gate structures (when viewed from above) having the desired dimensions in the gate-length and gate-width directions.

As shown in FIG. 1D, after the gate structures 101X are completely patterned, a sidewall spacer 109 is formed along the sidewalls 106S and the end surfaces 106E of the gate structures 101X. The sidewall spacer 109 may be formed by depositing a layer of spacer material, e.g., silicon nitride, and thereafter performing an anisotropic etching process on the layer of spacer material so as to result in the spacers 109 depicted in the FIG. 1D. The base thickness or width of the spacers 109 may vary depending upon the particular application, e.g., 5-15 nm. During the formation of the spacers 109, the gate insulation layer 105 serves as an etch mask to protect the surface of the active regions 102A, 102B. As shown in FIG. 1D, after the spacers 109 are formed, an etching process may be performed to remove the exposed portions of the gate insulation layer 105. Unfortunately, due to the tapering of the end surfaces 106E, the sidewall spacer 109 may not cover or encapsulate the entire end surface 106E of the gate electrode structure 106. That is, portions of the gate electrode 106 may be exposed after the spacers 109 are formed, as simplistically depicted in the dashed-line regions 113.

Next, as shown in FIG. 1E, an epi semiconductor material 115, e.g., silicon, silicon/germanium, is formed on the exposed portions of active regions 102A, 102B positioned outside of the spacers 109. Unfortunately, due to the existence of the exposed portions of the gate electrode 106, i.e., the regions 113 not covered by the sidewall spacers 109, undesirable epi material 115A may grow from the exposed portions of the gate electrode 106. In one scenario, as depicted in FIG. 1E, this undesirable epi material 115A may actually merge or contact a similar region of undesired epi material 115A formed on an adjacent transistor. Obviously, such a "bridging" situation may lead to reduced device performance and/or complete device failure.

The present disclosure is directed to various methods of forming gate structures by performing a gate-cut-last process and the resulting structures that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming gate structures by performing a gate-cut-last process and the resulting structures. One method disclosed includes, among other things, forming an uncut line-type gate structure above first and second spaced-apart active regions of a semiconductor substrate and above an isolation region formed in the substrate that is positioned between the first and second spaced-apart active regions, wherein the uncut line-type gate structure comprises a gate electrode and a gate cap layer positioned above the gate electrode and wherein the line-type gate structure has been patterned so as to have a desired critical dimension of a transistor device, forming a sidewall spacer around a perimeter of the line-type gate structure, performing at least one etching process to remove an axial portion of the gate cap layer and an axial portion of the gate electrode that are positioned above the isolation region so as to thereby define first and second cut end surfaces of first and second gate electrodes, respectively, and an isolation plug cavity positioned between the sidewall spacers and the first and second cut end surfaces of the first and second gate electrodes, and forming a gate cut isolation plug in the isolation plug cavity.

One illustrative integrated circuit product disclosed herein includes, among other things, first and second spaced-apart active regions defined in a semiconductor substrate, an isolation region formed in the substrate between the first and second spaced-apart active regions, first and second spaced-apart gate electrodes positioned above the first and second active regions, respectively, the first and second gate electrode structures comprising opposing first and second cut end surfaces, respectively, a sidewall spacer that is positioned adjacent sidewalls of the first and second spaced-apart gate electrodes, wherein the sidewall spacer extends across the isolation region, and a gate cut isolation plug having first, second, third and fourth sides, wherein the first side and the second side each contact one of the first and second cut end surfaces, and wherein the third side and the fourth side each contact a portion of the sidewall spacer that extends across the isolation region.

BRIEF DESCRIPTION OF THE DRAWINGS

The disclosure may be understood by reference to the following description taken in conjunction with the accompanying drawings, in which like reference numerals identify like elements, and in which:

FIGS. 1A-1E depict various illustrative prior art methods of forming gate structures of semiconductor devices.

Figure 1A:
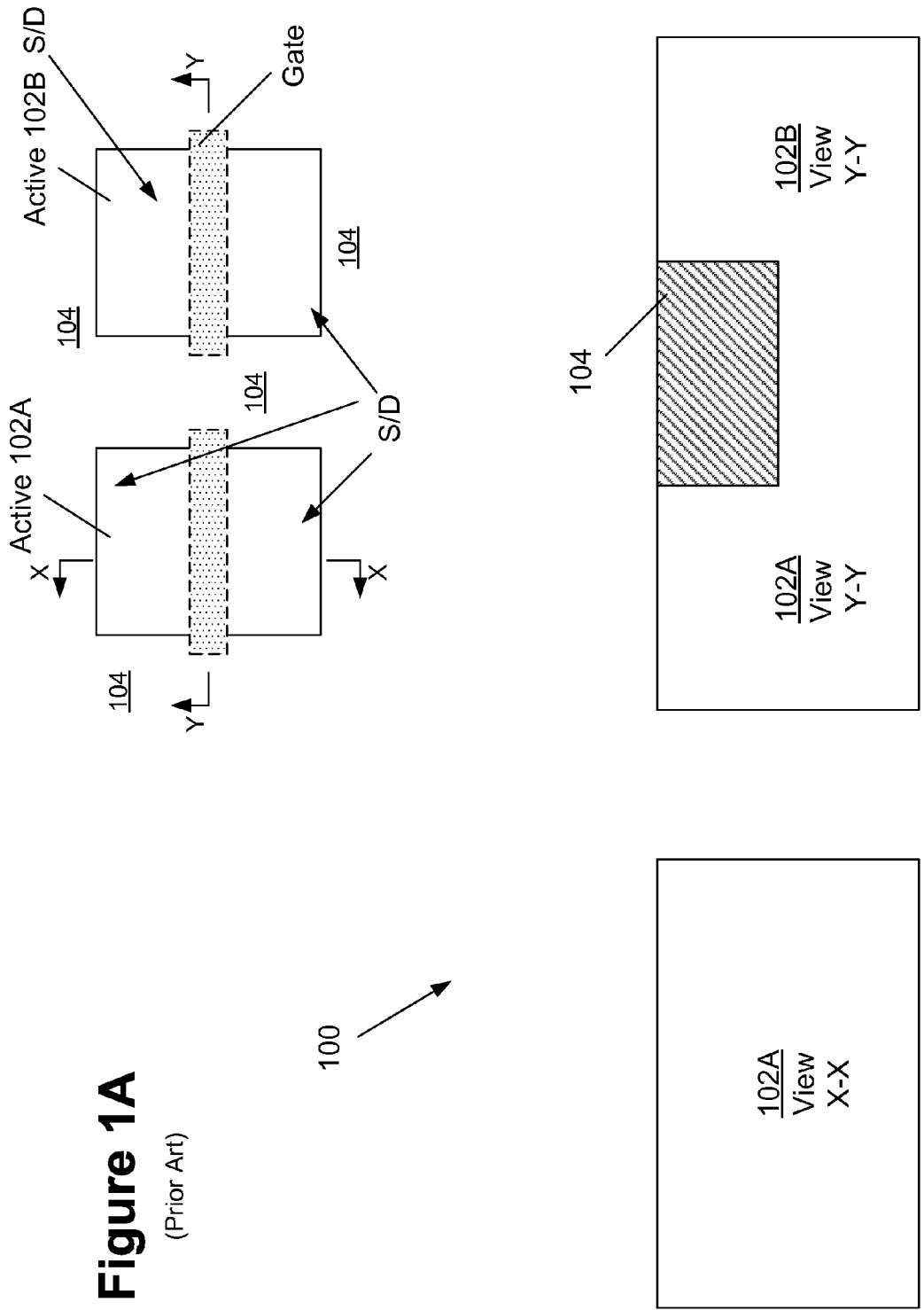

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming gate structures by performing a gate-cut-last process and the resulting structures. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. The methods disclosed herein may be employed in forming planar transistor devices as well as 3D devices, such as a FinFET device. Moreover, the methods disclosed herein may be employed in cases where the gate structure depicted herein is a final gate structure (i.e., a gate-first fabrication process) or where the gate structure depicted herein as a sacrificial gate structures (i.e., a gate-last or replacement gate process). With reference to the attached figures, various illustrative embodiments of the methods and devices disclosed herein will now be described in more detail.

Figure 2D:
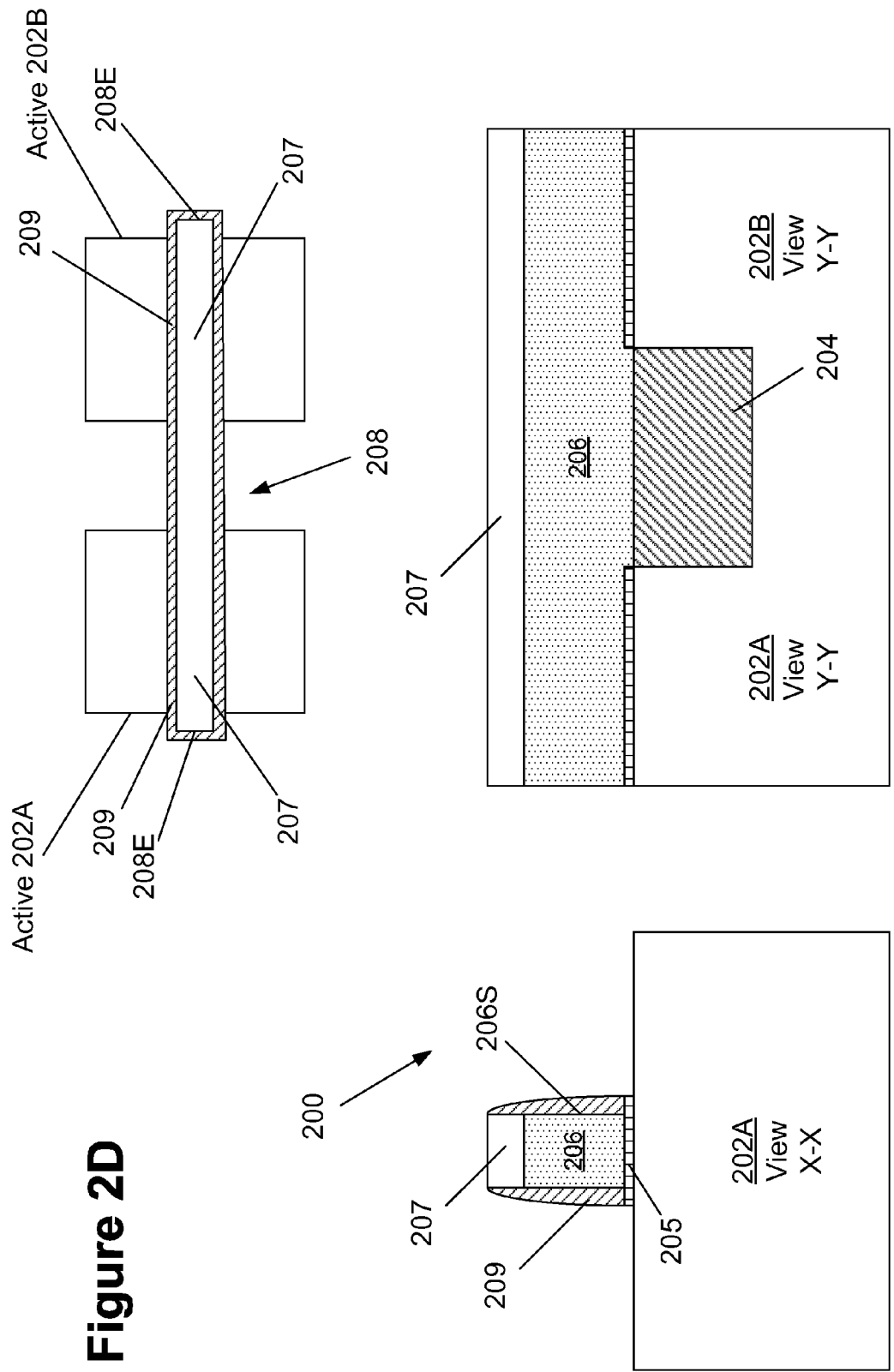
FIGS. 2A-2N depict various methods disclosed herein for forming gate structures by performing a gate-cut-last process and the resulting structures.
Figure 2E:
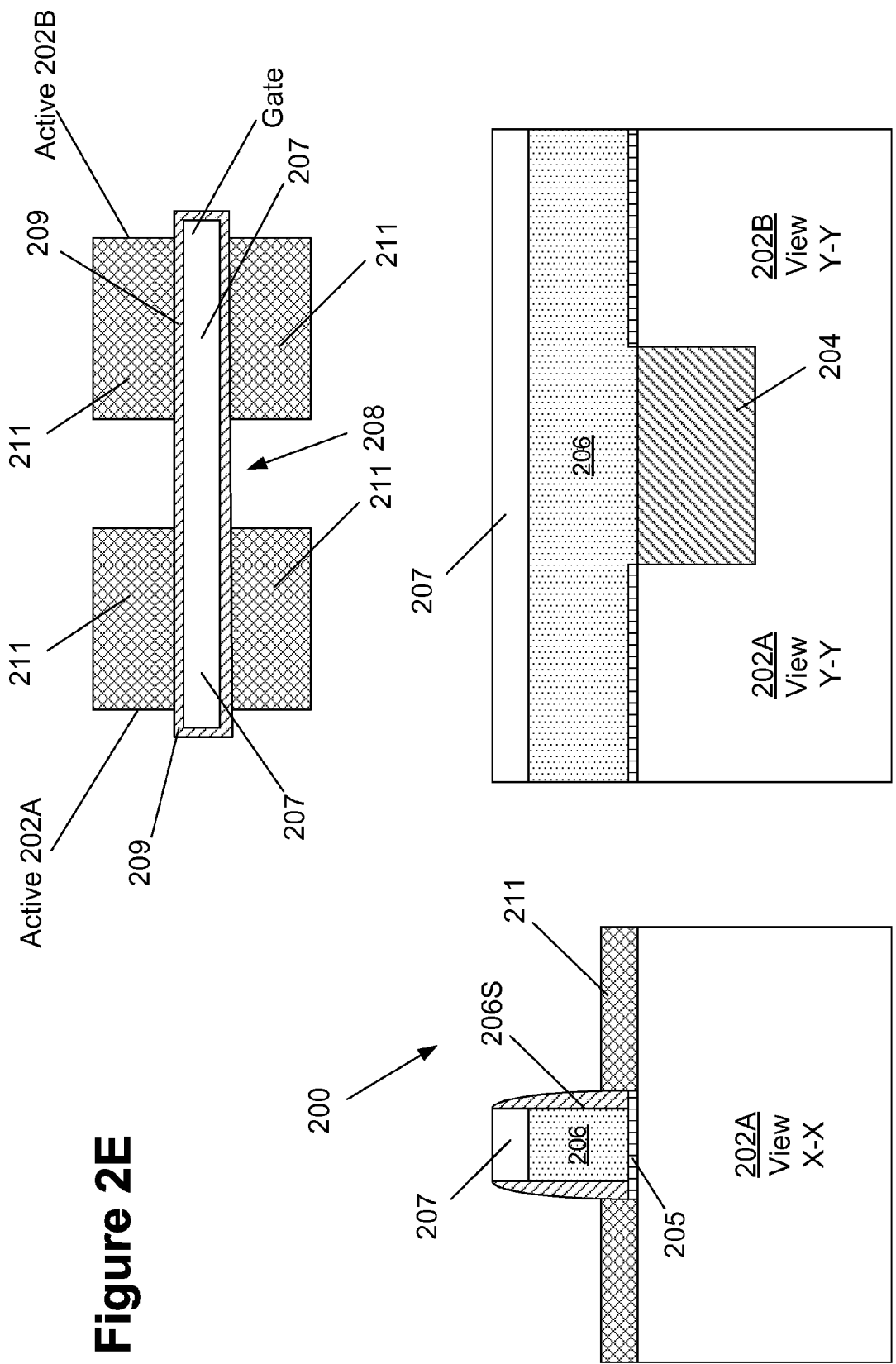
Figure 2G:
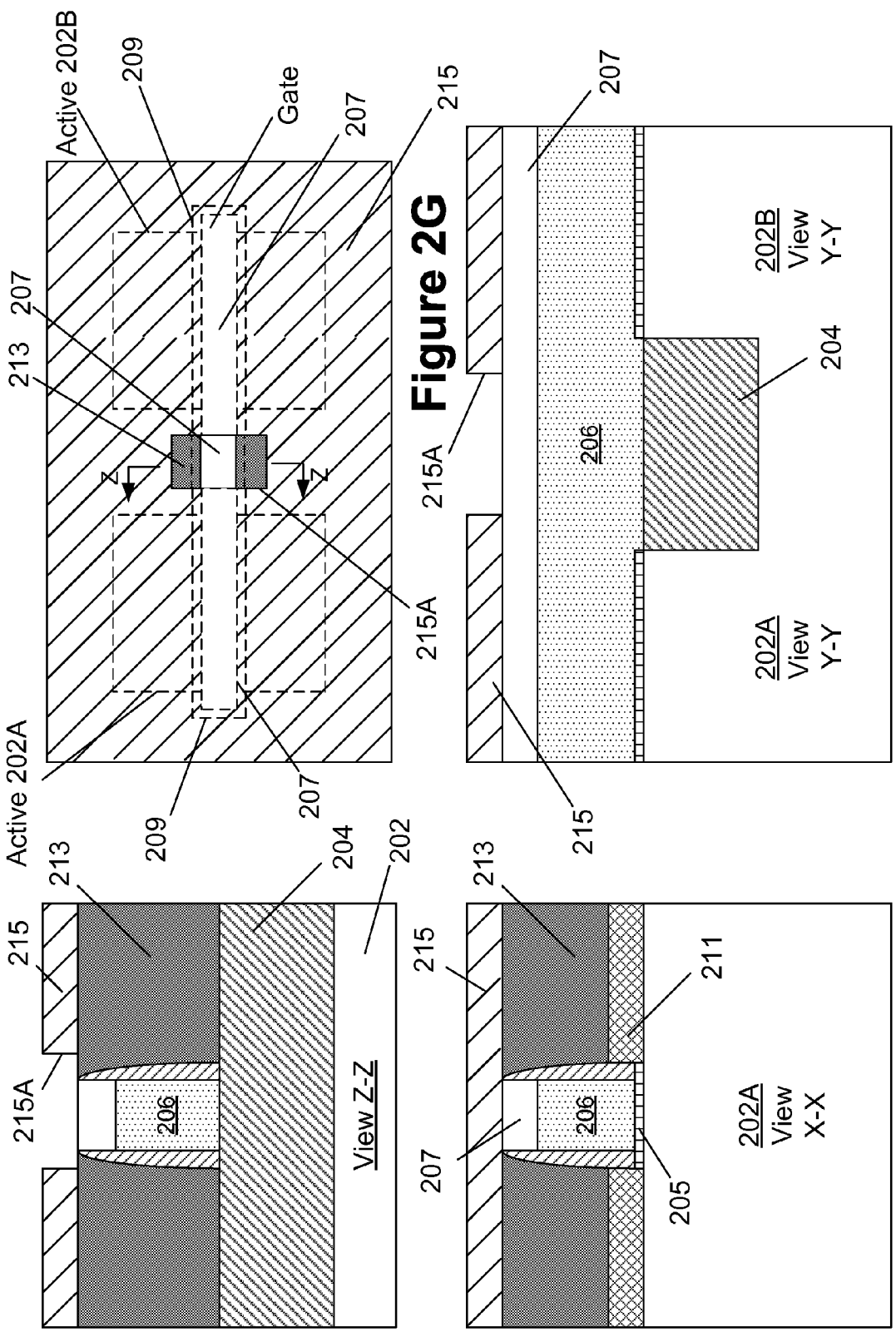
Figure 2H:
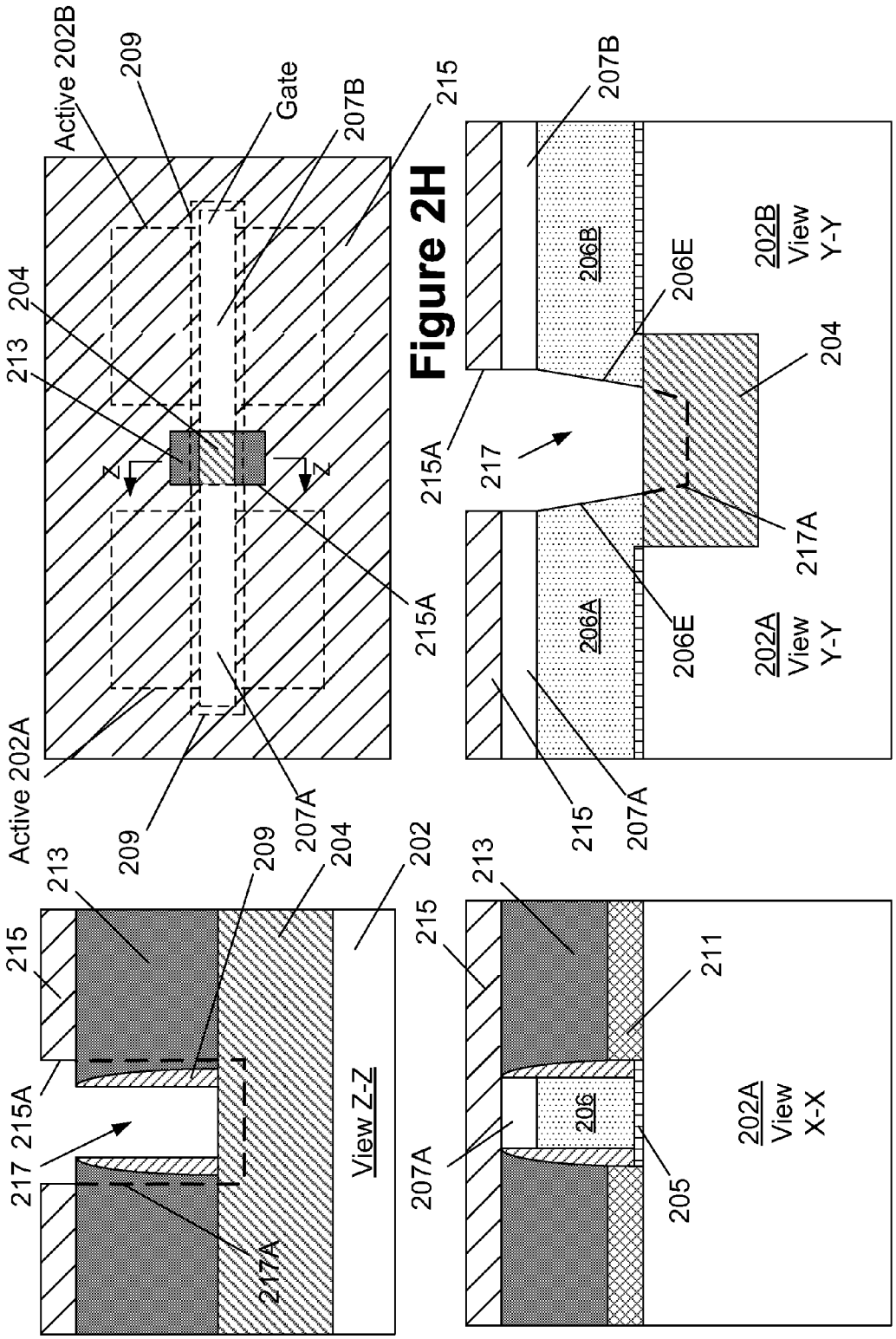
Figure 2I:
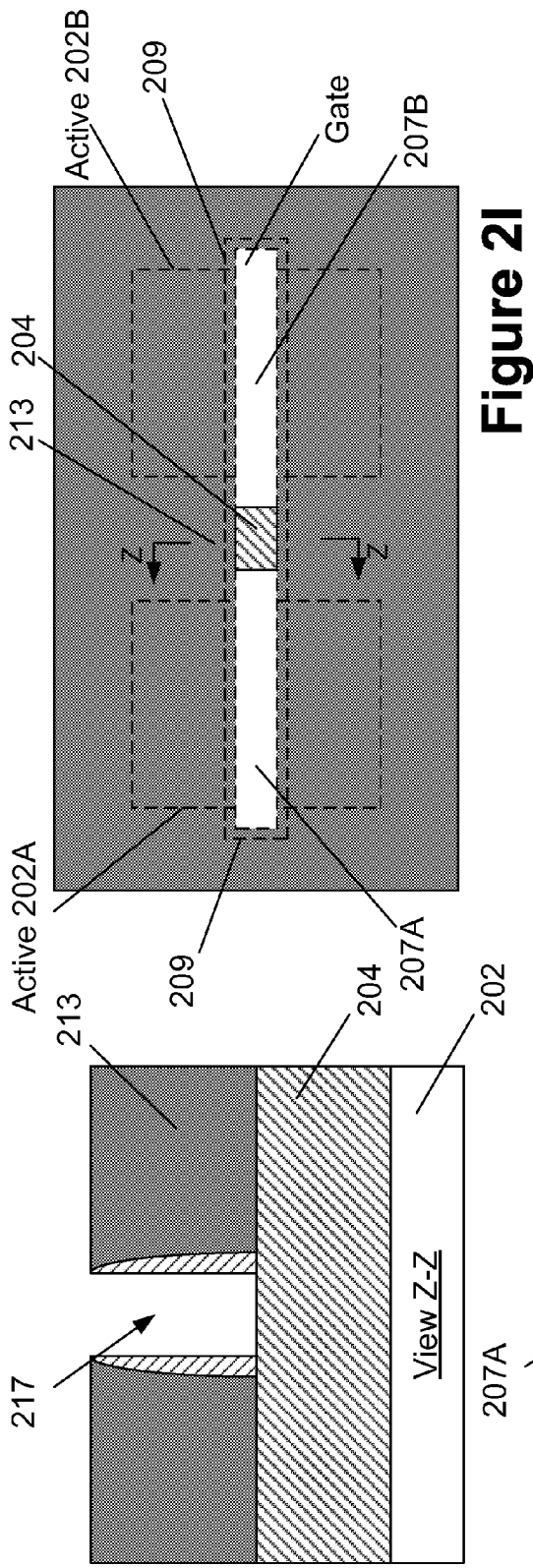
Figure 2I:
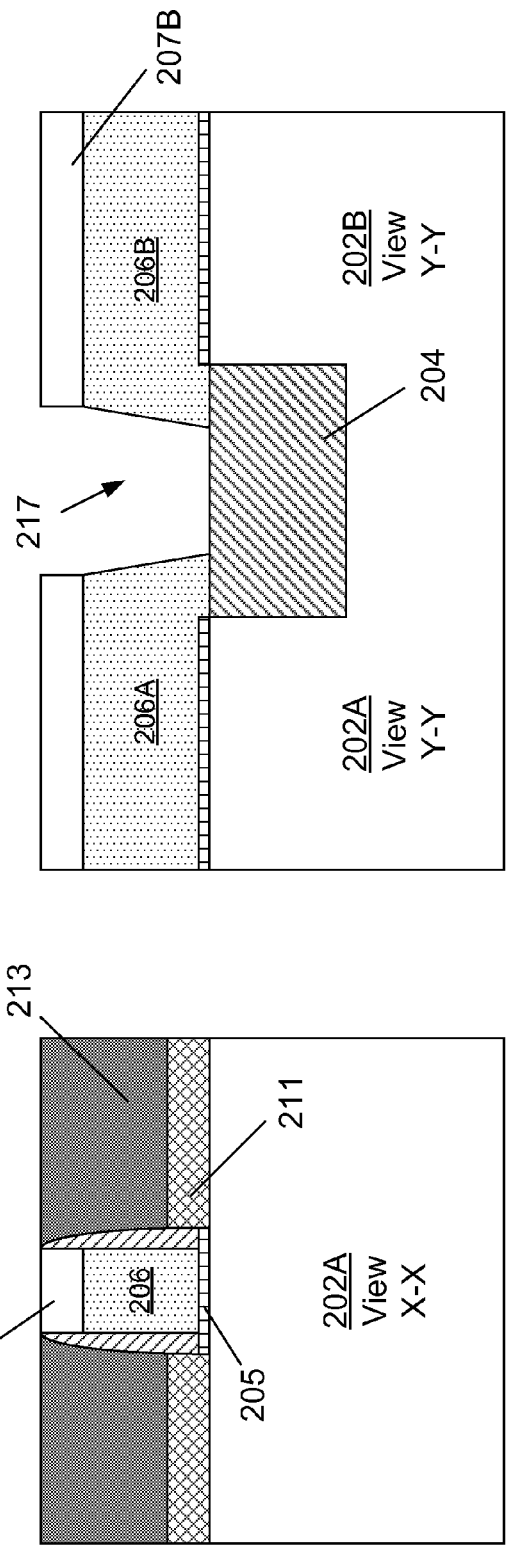
Figure 2J:
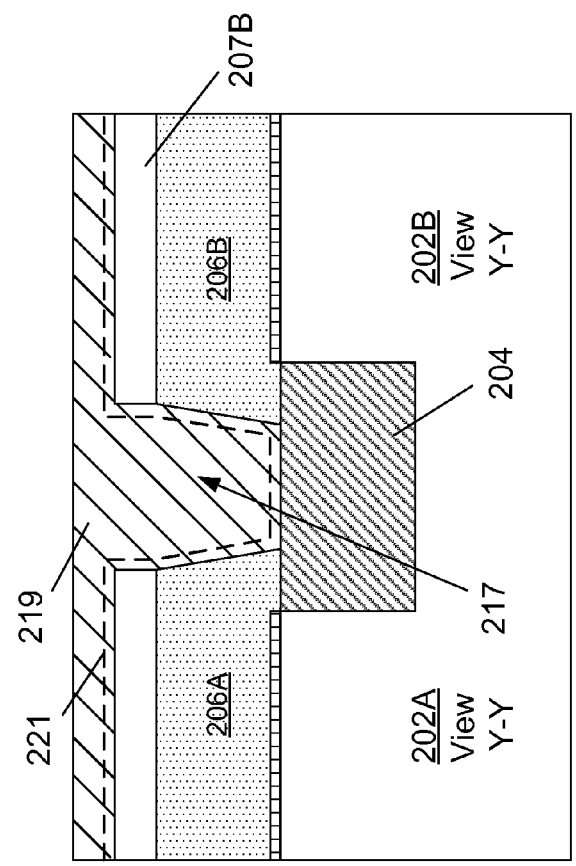
Figure 2J:
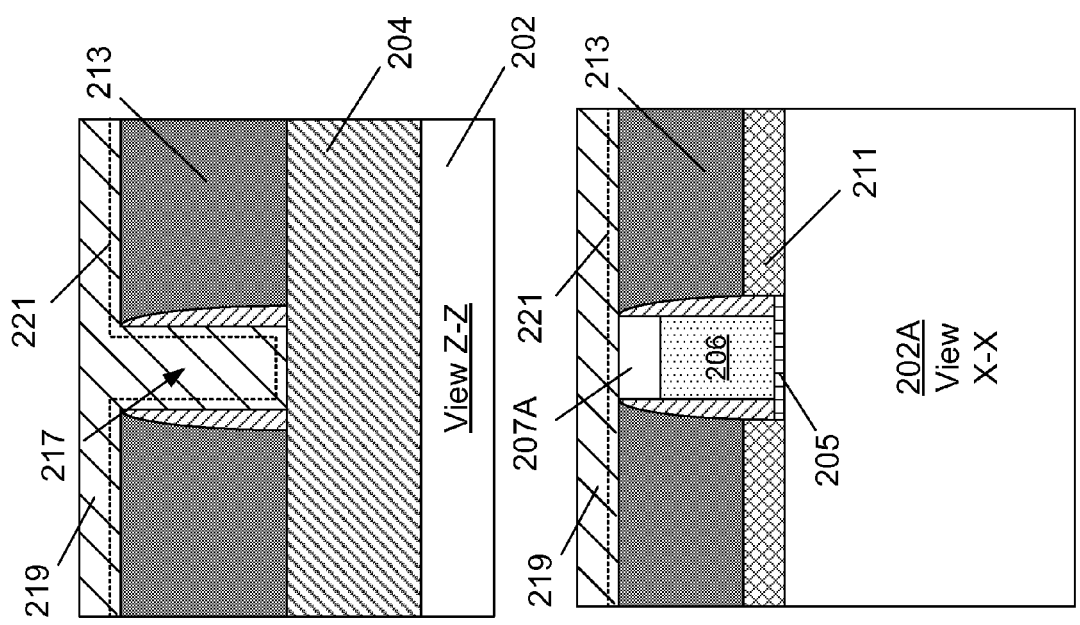
Figure 2K:
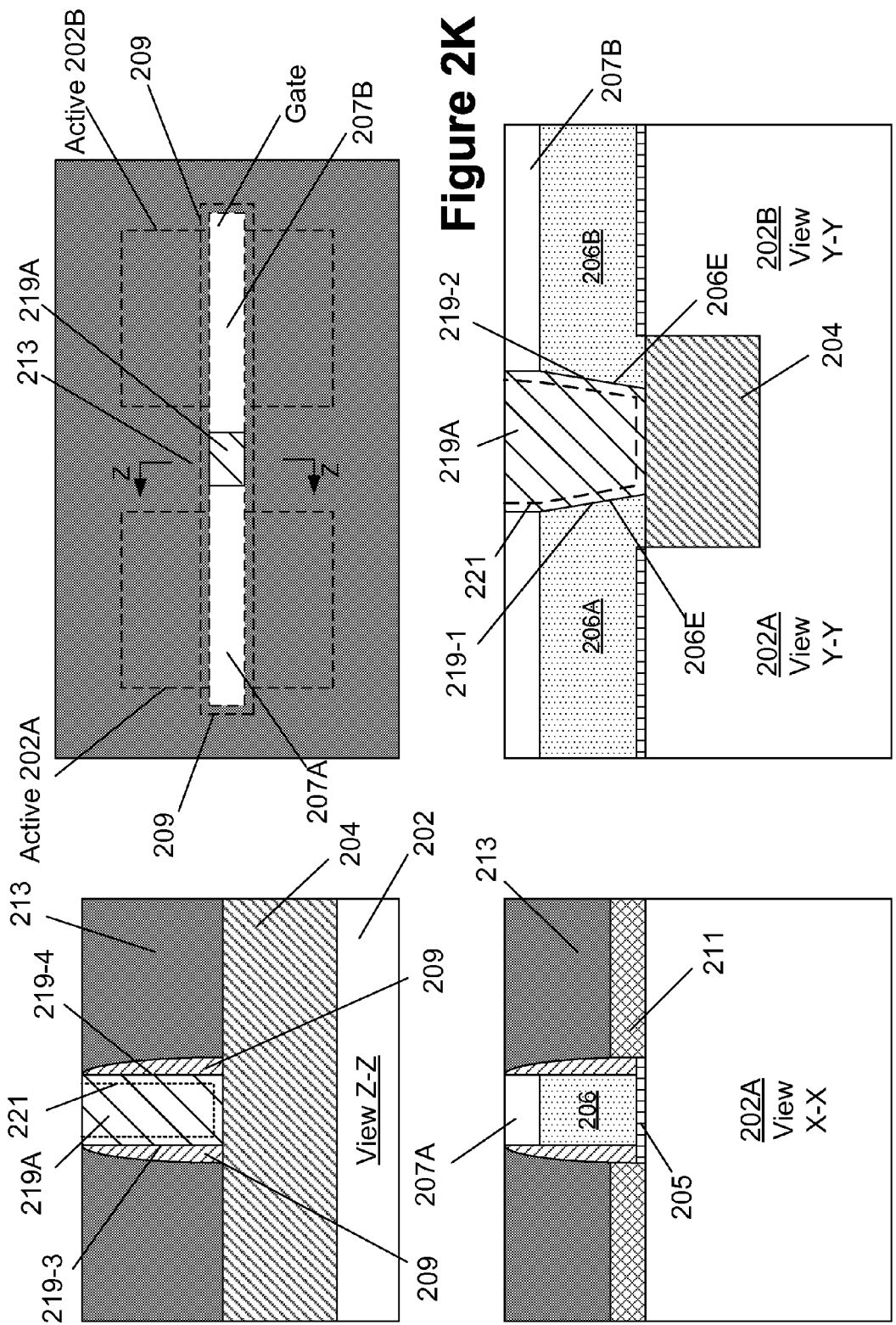
Figure 2N:
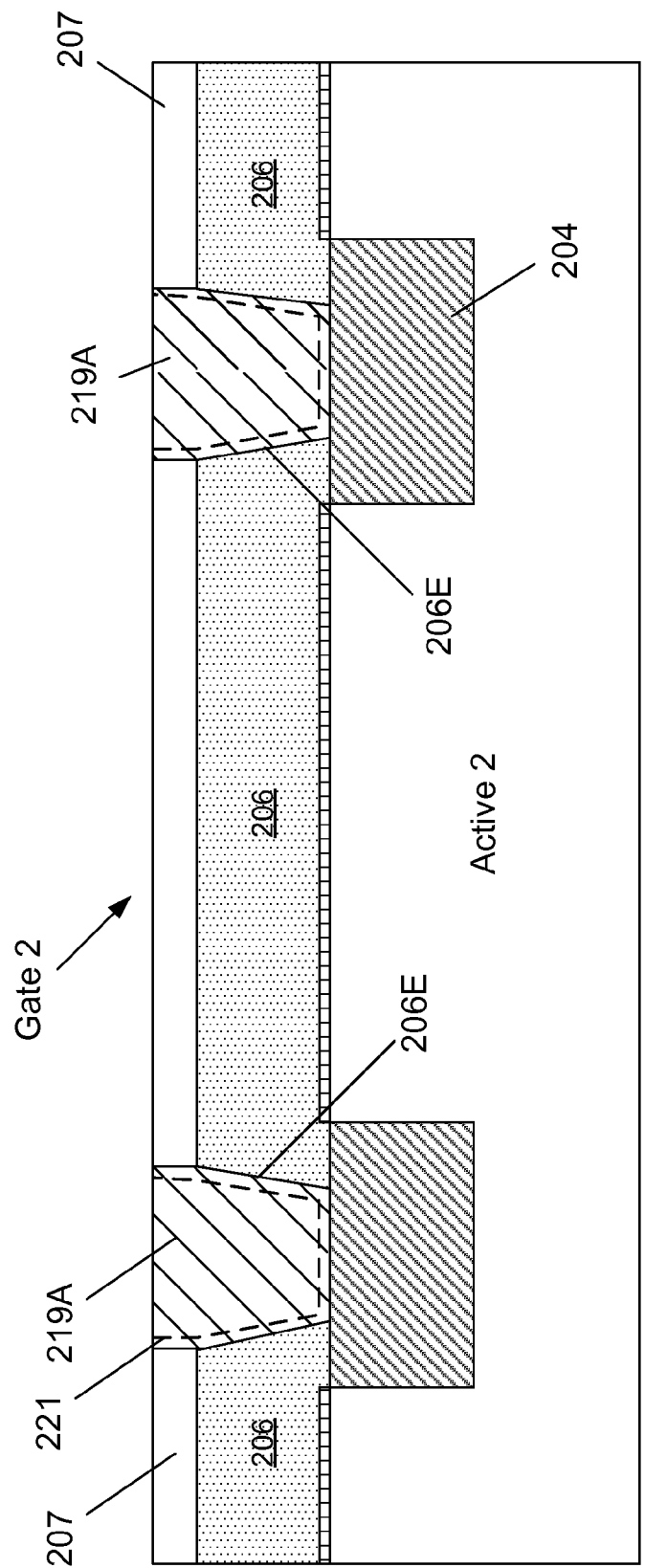

FIGS. 2A-2N depict various novel methods of forming gate structures by performing a gate-cut-last process and the resulting novel structures. In general, the drawings contain a plan view and various cross-sectional views that are taken where indicated in the plan view. The plan view in FIG. 2A depicts two spaced-apart active regions 202A, 202B that are separated by isolation material 204, and two illustrative gate structures (depicted in dashed lines in FIG. 2A since they are not yet formed at this point in the process flow). With continuing reference to the plan view in FIG. 2A, the view "X-X" is a cross-sectional view taken along the "gate-length" or current transport direction for the finished transistor devices formed above the active region 202A, i.e., a cross-sectional view through the gate structures. The view "Y-Y" is a cross-sectional view that is taken through the long axis of the gate structures formed above both of the active regions 202A, 202B, i.e., a cross-sectional view through the gate structures in the gate-width direction of the transistor devices.

As will be appreciated by those skilled in the art after a complete reading of the present application, various doped regions, e.g., source/drain regions, halo implant regions, well regions and the like, are also not depicted in the attached drawings. The illustrative integrated circuit product 200 depicted in the drawings is formed above an illustrative substrate 202 that may have a variety of configurations, such as the depicted bulk silicon configuration. The substrate 202 may be made of silicon or it may be made of materials other than silicon. Thus, the terms "substrate" or "semiconductor substrate" should be understood to cover all semiconducting materials and all forms of such materials.

FIG. 2A depicts the product 200 at a point in fabrication wherein the spaced-apart active regions 202A, 202B were defined in the substrate 202 by the formation of an isolation structure 204. The isolation structure 204 may be formed using well-known techniques. The overall size of the active regions 202A, 202B may vary depending upon the particular application.

FIG. 2B depicts the integrated product 200 after a layer of gate insulation material 205, a layer of gate electrode material 206 and a layer of gate cap material 207 have been formed on the product 200. In the plan view in FIG. 2B, the outlines of the active regions 202A, 202B are depicted in dashed lines for reference purposes. The gate insulation material 205 and the gate electrode material 206 should be understood to be representative in nature as they may be comprised of any of a variety of different materials that may be formed using a variety of different techniques. For example, the gate insulation material 205 may be comprised of a variety of different materials, such as, for example, silicon dioxide, etc., while the gate electrode material 206 may be a material such as polysilicon or amorphous silicon, etc. In one illustrative embodiment, an oxidation process may be performed to form a gate insulation material 205 comprised of silicon dioxide on the spaced-apart active regions 202A, 202B. If desired, the gate insulation material 205 may also be formed by performing any of a variety of known deposition processes. Thereafter, the gate electrode material layer 206 may be blanket-deposited across the entire substrate 202 and on the previously formed gate insulation material 205. Then, the layer of gate cap material 207, e.g., silicon nitride, may be blanket-deposited on the gate electrode material layer 206. The layers of material depicted in FIG. 2B, as well as the layers of material described below, may be formed by any of a variety of different known techniques, e.g., a chemical vapor deposition (CVD) process, an atomic layer deposition (ALD) process, a thermal growth process, spin-coating techniques, etc. As noted previously, the final gate electrodes for the transistor devices disclosed herein may be formed using either gate-first or gate-last techniques. For purposes of disclosing the present subject matter, no distinction will be made as it relates to whether the gate structures (comprised of the gate insulation material 205, the gate electrode material 206 and the gate cap layer 207) are final or sacrificial in nature expect where such distinction is needed to address or explain a particular point. In the case where transistor devices are manufactured using so-called gate-first processing techniques, the gate structures are final gate structures for the transistor devices. In the situation where transistor devices are manufactured using so-called gate-last processing techniques, the gate structures (gate electrode 206, gate insulation layer 205 and gate cap layer 207) are sacrificial in nature and will be subsequently removed (after several process operations are performed) and replaced with final gate structures for the devices. In the gate-last processing technique, the final gate structures typically include one or more layers of high-k (k greater than 10) insulating material and one or more layers of metal that constitute at least part of the conductive gate electrode of the final gate structure.

FIG. 2C depicts the product 200 after the gate cap material layer 207 and the layer of gate electrode material 206 were patterned to define an extended line-type, uncut gate structure 208 that extends across the two active regions 202A-B and above the isolation material 204. Eventually, the line-type structure 208 will be cut to define the separate gate electrodes above each of the active regions 202A-B. This patterning process defines the gate length 206L or critical dimension of the gate structures. Note that the sidewalls 206S of the gate electrode 206 is substantially vertical due to the nature of the anisotropic etching processes that were performed to define the uncut gate structure 208. As will be appreciated by those skilled in the art, in a "real-world" device, the uncut gate structure 208 may span across an entire wafer and several separate active regions defined in the substrate 202.

As shown in FIG. 2D, a sidewall spacer 209 is formed along the sidewalls 206S and the terminal ends 208E of the uncut gate structure 208, i.e., around the perimeter of the uncut gate structure 208. The sidewall spacer 209 may be formed by depositing a layer of spacer material, e.g., silicon nitride, and thereafter performing an anisotropic etching process on the layer of spacer material so as to result in the spacers 209 depicted in FIG. 2D. The base thickness or width of the spacers 209 may vary depending upon the particular application, e.g., 3-15 nm. During the formation of the spacers 209, the gate insulation layer 205 serves as an etch mask to protect the surface of the active regions 202A, 202B. As shown in FIG. 2D, after the spacers 209 are formed, an etching process may be performed to remove the exposed portions of the gate insulation layer 205 so as to expose the surface of the substrate 202 (or fin in the case of a FinFET device). Note that the spacers 209 extend across the entire isolation region 204.

Figure 1C:
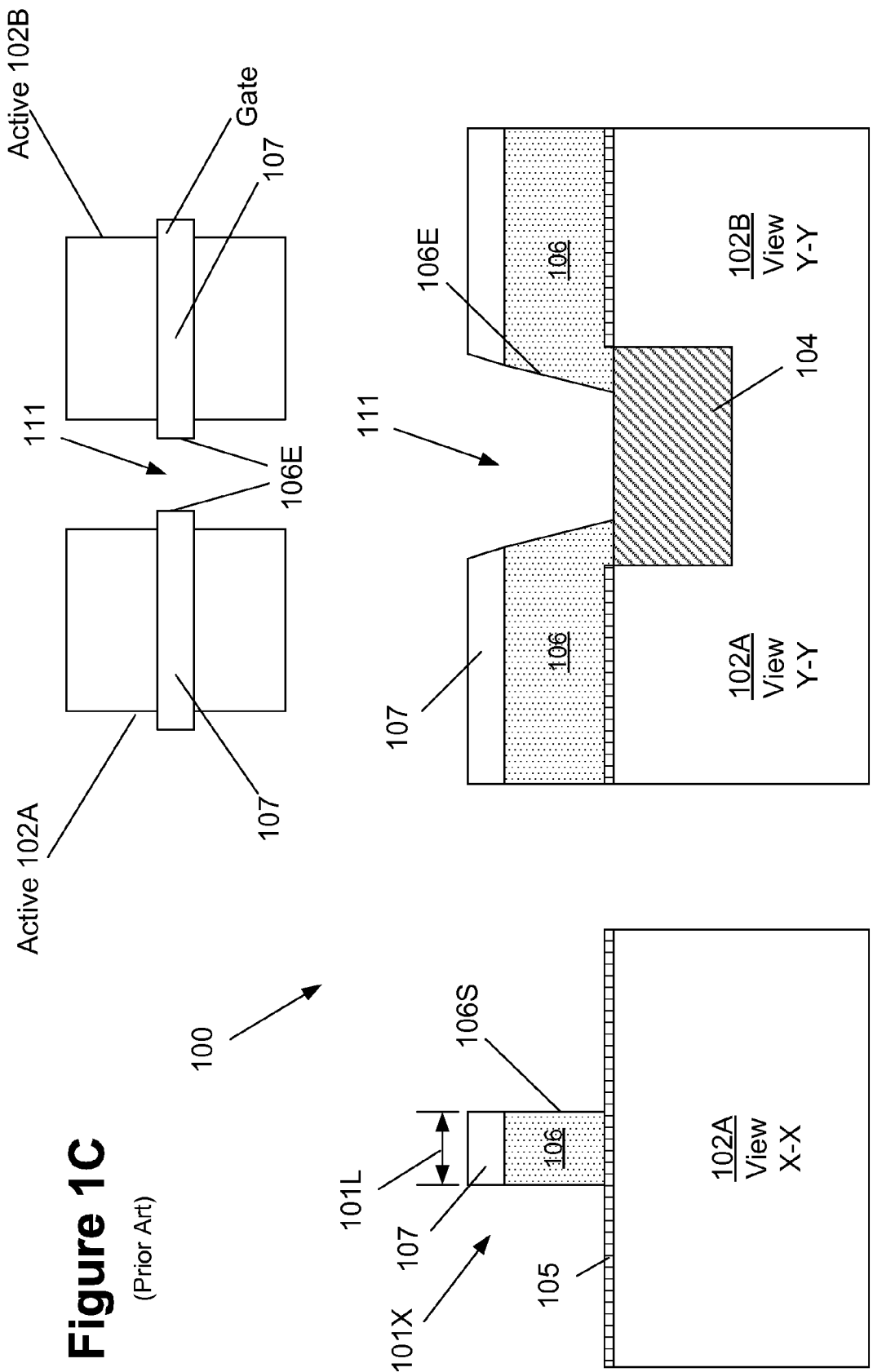
Figure 1D:
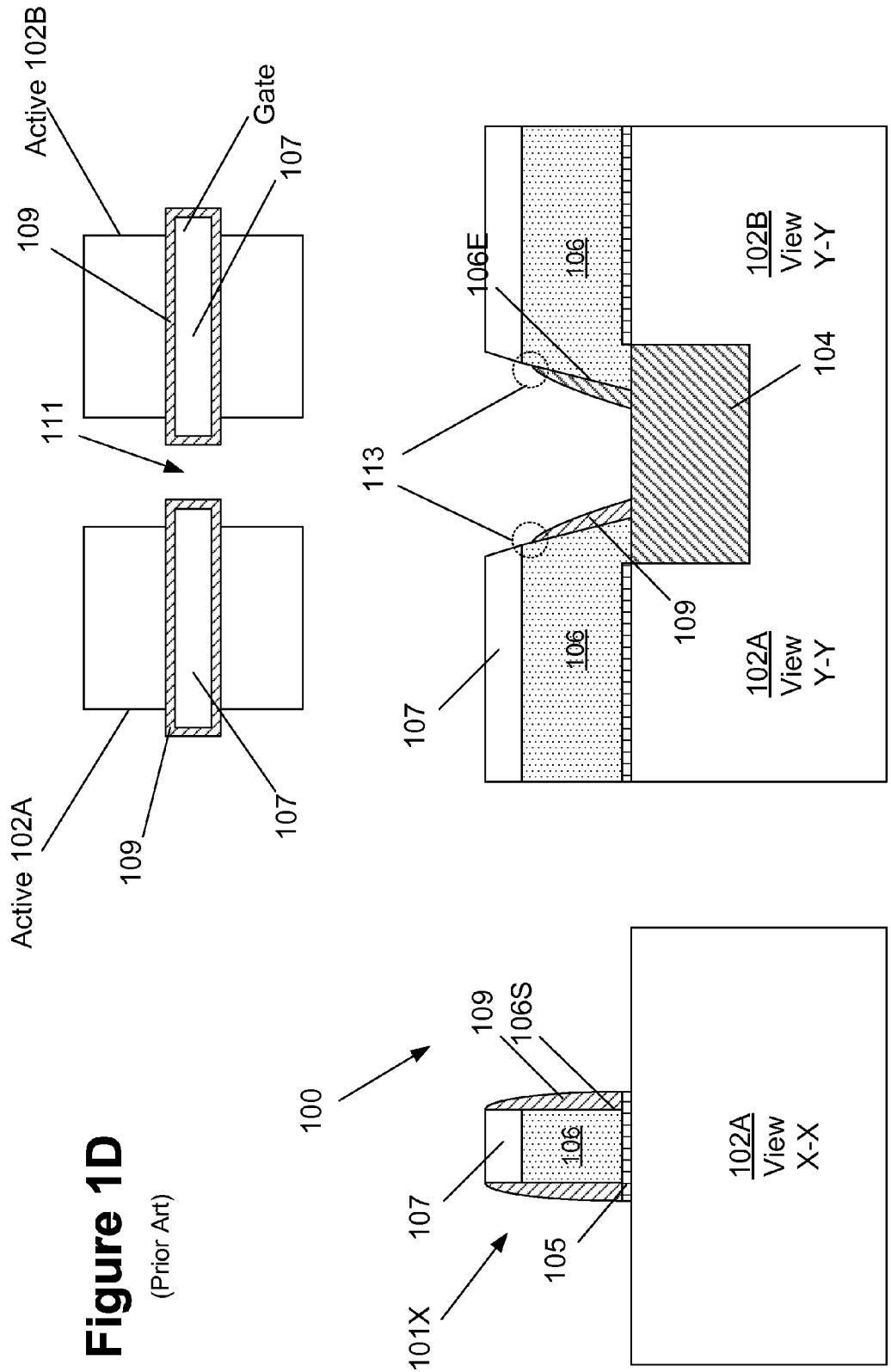
Figure 1E:
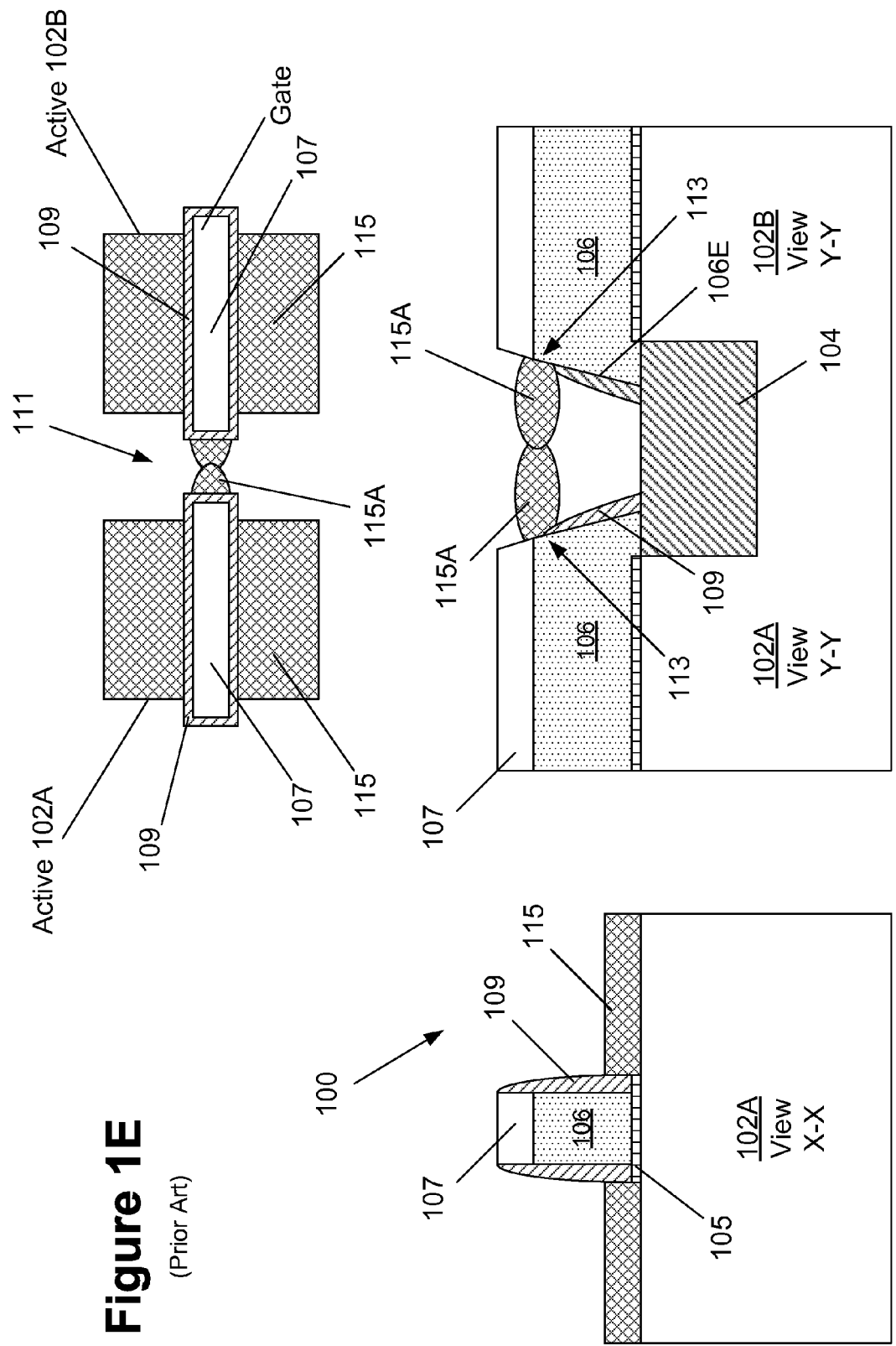

Next, as shown in FIG. 2E, an epi semiconductor material 211, e.g., silicon, silicon/germanium, etc., was formed on the exposed portions of active regions 202A, 202B positioned outside of the spacers 209. Note that, unlike the prior art process flow described in the background section of this application, since the uncut gate structure 208 remains uncut at this point in the process flow, there is no possibility of forming epi material 211 in a space between previously cut gate structures, such as the space 111 between the two separate gate structures positioned above the active regions 102A-B, shown in FIG. 1C. Accordingly, the process flows disclosed herein eliminate the chance for undesirable bridging of epi semiconductor material, like the bridged epi material 115A shown in FIG. 1E.

FIG. 2F depicts the product 200 after a layer of insulating material 213 was deposited across the product and a planarization process, such as a CMP process or an etch-back process, was performed using the gate cap layer 207 as a polish-stop layer or an etch-stop layer to remove the portions of the layer of insulating material 213 positioned above the gate cap layer 207. The layer of insulating material 213 may be comprised of a variety of different materials as well, e.g., silicon dioxide, and it may be formed using a CVD process.

FIG. 2G depicts the product 200 after a patterned gate-cut mask layer 215, having an opening 215A formed therein, was formed above the product. As depicted, the opening 215A in the gate-cut mask layer 215 exposes an axial portion of the uncut gate structure 208 positioned above the isolation material 204 for removal, i.e., a portion of the axial length of the uncut gate structure 208 is exposed so it can be removed. The patterned gate-cut mask layer 215 may be comprised of a variety of different materials, e.g., a patterned photoresist etch mask. Also note that FIG. 2G contains an additional cross-sectional view Z-Z that is taken through the opening 215A in a direction that is parallel to the gate-length direction of the transistor devices.

FIG. 2H depicts the product 200 after one or more anisotropic etching processes have been performed through the opening 215A in the gate-cut mask layer 215 to remove an axial portion of the gate cap layer 207 and an axial portion of the gate electrode 206 so as to thereby define an isolation plug cavity 217. This etching process defines first and second separate gate electrodes 206A/206B each having a tapered cut end surface 206E (view Y-Y), as well as first and second gate cap layers 207A/B. Due to the nature of the anisotropic etching processes, portions of the sidewall spacers 209 remain intact. In the depicted example, the isolation plug cavity 217 is bounded laterally by the spacers 209 (view Z-Z), the cut end surfaces 206E (view Y-Y) and the gate cap layers 207A/B (view Y-Y). Formation of the isolation plug cavity 217 completes the definition of the individual rectangular-shaped gate electrodes 206A/B positioned above the active regions 202A-B, respectively. Of course, if desired, the etching process can be performed so as to remove all of the materials, e.g., the spacers 209 and the layer 213 that are exposed by the opening 215A. Moreover, the etching process can be performed in such a manner that the isolation plug cavity 217 extends into the isolation material, thereby making the isolation plug cavity 217 deeper than the height of the gate so as to thereby further insure complete isolation between the gates 207A and 207B. The outline of such a deeper and wider isolation plug cavity 217A is depicted in dashed lines in FIG. 2H only (views Y-Y and Z-Z). Thus, in the depicted example, the gate structures are cut to their desired axial length and the isolation plug cavity is formed prior to forming contact structures to each of the first and second gate structures.

FIG. 2I depicts the product 200 after the gate-cut mask layer 215 was removed.

FIGS. 2J-2K depict the product 200 after one or more process operations are performed to fill the isolation plug cavity 217 with a gate cut isolation plug that effectively insulates and separates the two individual gate electrodes 206A/B. Accordingly, FIG. 2J depicts the device after a layer of isolating insulating material 219 is formed so as to over-fill the isolation plug cavity 217. The layer of isolating insulating material 219 may be comprised of a variety of different material, e.g., silicon dioxide, and it may be made of the same or a different material as that of the layer of insulating material 213. If desired, a liner layer 221 may be formed prior to the formation of the layer of insulating material 219. For example, the liner layer 221 may be made of a high-k material (k value of 10 or greater) such as hafnium oxide or aluminum oxide. Such a liner layer 221 may be formed so as to function as an etch-stop or polish-stop layer in a particular process flow, e.g., a replacement gate process flow.

FIG. 2K depicts the product 200 after one or more CMP processes were performed using the gate cap layers 207A/B as polish-stop layers. This results in the formation of a gate cut isolation plug 219A in the isolation plug cavity 217. When present, the liner layer 221 should be considered to be part of the gate cut isolation plug 219A. With continuing reference to FIG. 2K, in the depicted example, the gate cut isolation plug 219A is formed such that a first side 219-1 and a second side 219-2 of the gate cut isolation plug 219A each contact one of the cut ends 206E of the first and second gate electrodes 206A/B, while a third side 219-3 and a fourth side 219-4 of the gate cut isolation plug 219A each contact a sidewall spacer 209. Upper portions of the gate cut isolation plug 219A also contact the gate cap layers 207A/B. Additionally, in the case where the isolation plug cavity 217A (see FIG. 2H) is formed larger, the gate cut isolation plug is formed such that a first side and a second side of the gate cut isolation plug 219A such that the third side and fourth sides of the gate cut isolation plug 219A each contact the layer of insulating material 213.

FIG. 2L is a plan view of the product which is provided in an effort to further explain the novel structures depicted herein. In FIG. 2L the layer of insulating material 208 has been removed. As can be seen in FIG. 2L, the gate cut isolation plug 219A separates the ends of the two separate gate structures formed above the active regions 202A-B, respectively. Additionally, it should be noted that the gate cut isolation plug 219A is laterally bounded by portions of the sidewall spacers 209 that extend along the sidewalls of the two gate structures and across the isolation material 204.

FIG. 2M is another plan view of the product, wherein gates structures 1-3 are formed above active regions 1-3, respectively. As depicted, gate cut isolation plugs 219A are formed at opposite ends of gate structure 2 so as to define gate structure 2. Gates 1 and 3 have one end defined by gate cut isolation plug 219A and the other end defined by a terminal end of the original uncut gate structure 208.

FIG. 2N is a cross sectional view of Gate 2 taken in the gate width direction of the device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming an uncut line-type gate structure above first and second spaced-apart active regions of a semiconductor substrate and above an isolation region formed in said substrate that is positioned between said first and second spaced-apart active regions, wherein said uncut line-type gate structure comprises a gate electrode structure and a gate cap layer positioned above said gate electrode structure and wherein said line-type gate structure has been patterned so as to have a desired critical dimension of a transistor device;
   forming a sidewall spacer around a perimeter of said line-type gate structure;
   after forming said sidewall spacer, performing at least one etching process to remove an axial portion of said gate cap layer and an axial portion of said gate electrode that are positioned above said isolation region so as to thereby define first and second cut ends of first and second gate electrodes, respectively, and an isolation plug cavity positioned between said sidewall spacer and said first and second cut ends of said first and second gate electrodes; and
   forming a gate cut isolation plug in said isolation plug cavity.

2. The method of claim 1, wherein forming said gate cut isolation plug comprises depositing a layer of isolating insulating material in said isolation plug cavity and performing at least one CMP process using said gate cap layer of said first and second gate structures as a polish-stop.

3. The method of claim 2, wherein forming said gate cut isolation plug further comprises, prior to forming said layer of isolating insulating material, forming a liner layer in said isolation plug cavity.

4. The method of claim 1, wherein said gate cut isolation plug is formed such that a first side and a second side of said gate cut isolation plug each contact one of said first and second cut ends, while a third side and a fourth side of said gate cut isolation plug each contact a sidewall spacer.

5. The method of claim 1, wherein, after forming said sidewall spacer and prior to performing said at least one etching process, the method further comprises forming an epitaxial semiconductor material on exposed portions of said first and second active regions.

6. The method of claim 1, wherein said first and second gate electrodes are final gate electrodes for transistor devices to be manufactured using gate-first techniques.

7. The method of claim 1, wherein said first and second gate electrodes are sacrificial gate electrodes for transistor devices to be manufactured using replacement gate techniques.

8. The method of claim 1, wherein said gate electrode structure is comprised of polysilicon or amorphous silicon.

9. The method of claim 1, wherein said at least one etching process that is performed to define said isolation plug cavity is performed prior to forming contact structures to each of said first and second gate structures.

10. The method of claim 1, wherein, after forming said sidewall spacer and prior to performing said at least one etching process, the method further comprises forming a layer of insulating material above said substrate and where said gate cut isolation plug is formed such that a first side and a second side of said gate cut isolation plug each contact one of said first and second cut ends, while a third side and a fourth side of said gate cut isolation plug each contact said layer of insulating material.

11. A method, comprising:
forming an uncut line-type gate structure above first and second spaced-apart active regions of a semiconductor substrate and above an isolation region formed in said substrate that is positioned between said first and second spaced-apart active regions, wherein said uncut line-type gate structure comprises a gate electrode structure and a gate cap layer positioned above said gate electrode structure and wherein said line-type gate structure has been patterned so as to have a desired critical dimension of a transistor device;
forming a sidewall spacer around a perimeter of said line-type gate structure;
forming a layer of insulating material above said line-type gate structure, said isolation region and said first and second spaced-apart active regions;
performing a planarization process on said layer of insulating material so as to expose an upper surface of said gate cap layer;
forming a patterned gate cut mask above said substrate, wherein said patterned gate cut mask has an opening formed therein that is positioned above said isolation region and exposes an axial portion of said gate cap layer;
performing at least one etching process through said opening in said gate cut mask to remove said exposed axial portion of said gate cap layer and an axial portion of said gate electrode so as to thereby define first and second cut ends of first and second gate electrodes, respectively, and an isolation plug cavity positioned between said sidewall spacer and said first and second cut ends of said first and second gate electrodes; and
forming a gate cut isolation plug in said isolation plug cavity.

12. The method of claim 11, wherein forming said gate cut isolation plug comprises depositing a layer of isolating insulating material in said isolation plug cavity and performing at least one CMP process using said gate cap layer of said first and second gate structures as a polish-stop.

13. The method of claim 12, wherein forming said gate cut isolation plug further comprises, prior to forming said layer of isolating insulating material, forming a liner layer in said isolation plug cavity.

14. The method of claim 11, wherein said gate cut isolation plug is formed such that a first side and a second side of said gate cut isolation plug each contact one of said first and second cut ends, while a third side and a fourth side of said gate cut isolation plug each contact a sidewall spacer.

15. The method of claim 11, wherein said gate cut isolation plug is formed such that a first side and a second side of said gate cut isolation plug each contact one of said first and second cut ends, while a third side and a fourth side of said gate cut isolation plug each contact said layer of insulating material.

16. The method of claim 11, wherein, after forming said sidewall spacer and prior to forming said layer of insulating material above said line-type gate structure, the method further comprises forming an epitaxial semiconductor material on exposed portions of said first and second active regions.

17. An integrated circuit product, comprising:
first and second spaced-apart active regions defined in a semiconductor substrate;
an isolation region formed in said substrate between said first and second spaced-apart active regions;
first and second spaced-apart gate electrodes positioned above said first and second active regions, respectively, said first and second gate electrode structures comprising opposing first and second cut end surfaces, respectively;
a sidewall spacer that is positioned adjacent sidewalls of said first and second spaced-apart gate electrodes, wherein said sidewall spacer extends across said isolation region; and
a gate cut isolation plug having first, second, third and fourth sides, wherein said first side and said second side each contact one of said first and second cut end surfaces, and wherein said third side and said fourth side each contact a portion of said sidewall spacer that extends across said isolation region.

18. The device of claim 17, wherein said gate cut isolation plug is comprised of a liner layer and isolation insulting material, wherein said liner layer is positioned on said first and second cut end surfaces and on said sidewall spacer.

19. The device of claim 17, further comprising first and second gate cap layers positioned above each of said first and second gate electrodes, respectively, wherein said first and second sides of said gate cut isolation plug further contact said first and second gate cap layers, respectively.

20. The device of claim 19, wherein said first and second gate electrodes are final gate electrodes for transistor devices to be manufactured above said first and second active regions, respectively.

21. The device of claim 19, wherein said first and second gate electrodes are sacrificial gate electrodes for transistor devices to be manufactured above said first and second active regions, respectively.

22. An integrated circuit product, comprising:
first and second spaced-apart active regions defined in a semiconductor substrate;
an isolation region formed in said substrate between said first and second spaced-apart active regions;
first and second spaced-apart gate electrodes positioned above said first and second active regions, respectively, said first and second gate electrode structures comprising opposing first and second cut end surfaces, respectively;
a sidewall spacer that is positioned adjacent sidewalls of said first and second spaced-apart gate electrodes;
a layer of insulating material that is positioned above said substrate and said isolation region; and
a gate cut isolation plug having first, second, third and fourth sides, wherein said first side and said second side each contact one of said first and second cut end surfaces, and wherein said third side and said fourth side each contact a portion of said layer of insulating material positioned above said isolation region.

23. The device of claim 22, wherein said gate cut isolation plug is comprised of a liner layer and isolation insulating material, wherein said liner layer is positioned on said first and second cut end surfaces and on said sidewall spacer.

24. The device of claim 22, further comprising first and second gate cap layers positioned above each of said first and second gate electrodes, respectively, wherein said first and second sides of said gate cut isolation plug further contact said first and second gate cap layers, respectively.

\* \* \* \* \*